United States Patent
Morikawa et al.

(10) Patent No.: US 7,486,139 B2
(45) Date of Patent: Feb. 3, 2009

(54) VARIABLE TRANSCONDUCTANCE CIRCUIT

(75) Inventors: Hiroyasu Morikawa, Osaka (JP);
Masamichi Katada, Osaka (JP); Marie Nishinaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 93 days.

(21) Appl. No.: 11/481,861

(22) Filed: Jul. 7, 2006

(65) Prior Publication Data

US 2007/0018725 A1  Jan. 25, 2007

(30) Foreign Application Priority Data

Jul. 7, 2005 (JP) ............... 2005-198623
Apr. 13, 2006 (JP) ............... 2006-110550

(51) Int. Cl.
*H03F 3/45* (2006.01)

(52) U.S. Cl. ...................... 330/253; 330/254

(58) Field of Classification Search ............ 330/253, 330/254, 260; 327/359, 563
See application file for complete search history.

(56) References Cited

U.S. PATENT DOCUMENTS

| 5,451,901 | A | * | 9/1995 | Welland | 330/254 |
| 5,465,070 | A | | 11/1995 | Koyama et al. | |
| 5,610,547 | A | * | 3/1997 | Koyama et al. | 330/260 |
| 5,672,961 | A | * | 9/1997 | Entrikin et al. | 323/315 |
| 6,052,001 | A | | 4/2000 | Cho et al. | |
| 6,118,340 | A | * | 9/2000 | Koen | 330/253 |
| 6,791,415 | B2 | | 9/2004 | Mitteregger | |

FOREIGN PATENT DOCUMENTS

| JP | 62-74168 | 4/1987 |
| JP | 1-317009 | 12/1989 |
| JP | 3-88405 | 4/1991 |
| JP | 6-090127 | 3/1994 |
| JP | 11-068477 | 3/1999 |
| JP | 11-120273 | 4/1999 |
| JP | 2001-292051 | 10/2001 |
| JP | 2003-179447 | 6/2003 |
| JP | 2005-94091 | 4/2005 |

OTHER PUBLICATIONS

Chinese Office Action dated Jul. 11, 2008 and issued in a corresponding Chinese Patent Application.
Japanese Office Action, with English translation, issued in Japanese Patent Application No. JP 2006-110550, mailed Aug. 5, 2008.

* cited by examiner

*Primary Examiner*—Khanh V Nguyen
(74) *Attorney, Agent, or Firm*—McDermott Will & Emery LLP

(57) ABSTRACT

The variable transconductance circuit includes: a voltage-current conversion circuit for outputting a current signal linear with an input voltage signal; first and second MOS transistors for converting the current signal received to a square-root compressed voltage signal; and third and fourth MOS transistors for converting the square-root compressed voltage signal to a linear current signal. A bias current at the first and second MOS transistors and a bias current at the third and fourth MOS transistors are varied to control transconductance.

6 Claims, 12 Drawing Sheets

Variable gain amplifier 1071

Low-pass filter 1072

VARIABLE TRANSCONDUCTANCE CIRCUIT

CROSS-REFERENCE TO RELATED APPLICATIONS

This application claims priority under 35 U.S.C. §119 on patent application Ser. No. 2005-198623 filed in Japan on Jul. 7, 2005 and patent application Ser. No. 2006-110550 filed in Japan on Apr. 13, 2006, the entire contents of which are hereby incorporated by reference.

BACKGROUND OF THE INVENTION

The present invention relates to a differential amplifier circuit, and more particularly, to a variable transconductance circuit formed on a semiconductor integrated circuit, and an optical disk device having such a variable transconductance circuit placed on a signal processing path.

A conventional transconductance circuit disclosed in Japanese Laid-Open Patent Publication No. 11-68477 will be described with reference to FIG. 15.

MOS transistors M50 and M51 constitute an input differential pair biased with a current Io. When a voltage signal Vi is input, MOS transistors M56 and M57 respectively drive gate voltages of MOS transistors M52 and M53 so that the gate-source voltages thereof are constant. At this time, the input voltage signal Vi is converted to a current ΔI1 with a resistance R connected between the sources of the MOS transistors M50 and M51, and the current ΔI1 flows to the MOS transistors M52 and M53. This relationship is represented by Expression (1) below. The current ΔI1 is output from the drains of MOS transistors M54 and M55.

$$\Delta I1 = \frac{Vi}{R} \quad (1)$$

The output current ΔI1 is input into the drains of MOS transistors M58 and M59. The gate and drain of each of the MOS transistors M58 and M59 are connected to each other via a resistance Rg, and the gates thereof are common-connected. At this time, since the equal current flows to the MOS transistors M58 and M59, the current ΔI1 of Expression (1) flows to the resistances Rg, generating a voltage (V⁺-V⁻) at both ends of the resistances Rg. With this voltage (V⁺-V⁻), the gates of MOS transistors M60 and M61 are driven. A drain current difference ΔI2 between the MOS transistors M60 and M61 at this time is represented by Expression (2):

$$\Delta I2 = k\beta[(V^+ - Vth)^2 - (V^- - Vth)^2] \quad (2)$$
$$= 4k\sqrt{\beta \cdot Io} \cdot Rg \cdot \Delta I1$$
$$= 4k\sqrt{\beta \cdot Io} \cdot \frac{Rg}{R} \cdot Vi$$

where β=charge mobility×capacity of gate oxide film/2, k=(transistor size of MOS transistors M60 and M61)/(transistor size of MOS transistors M58 and M59), and Vth is a transistor threshold voltage.

From Expression (2), the transconductance (gm) is represented by Expression (3):

$$gm = 4k\sqrt{\beta \cdot Io} \cdot \frac{Rg}{R} \quad (3)$$

which indicates that gm is allowed to vary sequentially by varying Io.

Gm is proportional to the square root of Io according to Expression (3). Therefore, to allow gm to vary up to 10 times its minimum value, it is necessary to vary Io up to 100 times its minimum value. In general, the gate-source voltage Vgs and the operating current Io of a MOS transistor have a relationship (Vgs-Vth)∝√Io, in which if Io is increased by 100 times, Vgs-Vth will increase by 10 times. Since Vgs-Vth must be about 0.2 V at minimum to operate the MOS transistor in the saturation region, Vgs-Vth will be 2V at maximum. Low power supply voltage operation is therefore difficult, and also the 100-fold current variation will increase current consumption. Thus, wide-range gm variation and low power consumption are in a trade-off relationship.

To solve the problem described above, Japanese Laid-Open Patent Publication No. 2001-292051 discloses a configuration of connecting a plurality of transconductors in parallel to enable wide-range gm variation and low power supply voltage operation. However, this configuration still has problems in current consumption and on-board circuit area.

In optical disk devices such as DVDs, for example, a filter circuit used for signal processing must respond to a wide range of signals including a high-speed signal about 100 times as fast as the lowest-speed signal. Also, a variable gain amplifier, which normalizes a variation in signal amplitude caused by a medium and an optical pickup before performing signal processing, is required to provide a wide range of gains including a gain 10 to 20 times as large as the smallest gain. To achieve such a filter circuit and variable gain amplifier, a variable gm circuit serves as an important component. However, with a power supply voltage as low as just about 3V, the conventional variable gm circuit can only secure a variable range up to about five times the gm lowest value for one circuit. Therefore, a plurality of such variable gm circuits are connected in parallel or in series to achieve a filter circuit and variable gain amplifier. This causes the problems of increase in power consumption and on-board circuit area.

SUMMARY OF THE INVENTION

The variable transconductance circuit according to the present invention includes: a voltage-current conversion circuit for outputting a current signal linear with an input voltage signal (Vi); first and second MOS transistors (M1, M2) for converting the current signal received to a square-root compressed voltage signal; and third and fourth MOS transistors (M3, M4) for converting the square-root compressed voltage signal to a linear current signal, wherein transconductance is controlled by varying a bias current (Ia) for the first and second MOS transistors (M1, M2) and a bias current (Ia) for the third and fourth MOS transistors. Thus, by providing two control parameters (Ia, Ib), gm can be varied in a wide range. For example, a variation up to about 20 times its minimum value can be achieved with a power supply voltage as low as about 3 V.

Preferably, in the variable transconductance circuit described above, the voltage-current conversion circuit comprises: two operational amplifiers into which the input voltage signal (Vi) is input; and a resistance (R) interposed between outputs of the two operational amplifiers, each of the outputs of the two operational amplifiers serves as a source follower biased with a first current source (1) or a second current source (2), and the current signal is taken from a drain of the source follower, gates of the first and second MOS transistors (M1, M2) are grounded with a predetermined bias voltage, and the current signal output from the voltage-current conversion circuit is input into sources of the first and second MOS transistors, sources of the third and fourth MOS transistors (M3, M4) are common-connected, a third current source (3) is connected to the common-connected sources, and a gate of the third MOS transistor (M3) is connected to a source of one of the first and second MOS transistors (M1, M2) while a gate of the fourth MOS transistor (M4) is connected to a source of the other first or second MOS transistor (M1, M2), the variable transconductance circuit uses drains of the third and fourth MOS transistors (M3, M4) as current outputs, and controls transconductance by varying the current (Ia) from the first and second current sources (1, 2) and the current (Ib) from the third current source (3).

Preferably, in the variable transconductance circuit described above, the voltage-current conversion circuit includes: fifth and sixth MOS transistors (M5, M6) constituting an input differential pair into which the input voltage signal (Vi) is input; and a resistance (R) interposed between sources of the fifth and sixth MOS transistors (M5, M6), each of the fifth and sixth MOS transistors (M5, M6) is biased with a first current source (1) or a second current source (2) connected to a drain of the fifth or sixth MOS transistor, the source of the fifth MOS transistor (M5) is connected to a drain of one of the first and second MOS transistors (M1, M2) while the source of the sixth MOS transistor (M6) is connected to a drain of the other first or second MOS transistor (M1, M2), a gate voltage of each of the first and second MOS transistors (M1, M2) is driven with a drain voltage of the fifth MOS transistor (M5) or the sixth MOS transistor (M6) whichever is connected to the drain of the first or second MOS transistor, sources of the third and fourth MOS transistors (M3, M4) are common-connected, a third current source (3) is connected to the common-connected sources, and a gate voltage of the third MOS transistor (M3) is driven with the drain voltage of one of the fifth and sixth MOS transistor (M5, M6) while a gate voltage of the fourth MOS transistor (M4) is driven with the drain voltage of the other fifth or sixth MOS transistor (M5, M6), and the variable transconductance circuit uses drains of the third and fourth MOS transistors (M3, M4) as current outputs, and controls transconductance by varying the current (Ia) from the first and second current sources (1, 2) and the current (Ib) from the third current source (3).

Preferably, in the variable transconductance circuit described above, each of the first and second MOS transistors (M1, M2) or the third and fourth MOS transistors (M3, M4) is composed of a plurality of MOS transistors connected in parallel, and transconductance is controlled by switching. With this configuration, a further wide range of transconductance variation (for example, up to about 100 times the minimum gm) can be achieved.

Preferably, the variable transconductance circuit described above further includes a transconductance control circuit for generating the bias currents (Ia, Ib), wherein the transconductance control circuit includes: a square circuit (20) comprising a trans-linear loop circuit including vertically-connected seventh and eighth MOS transistors (M101, M102) with a gate and drain of each transistor being connected to each other, a ninth MOS transistor (M103) of which gate is connected to the gate of the eighth MOS transistor (M102), and a tenth MOS transistor (M104) of which gate is connected to a source of the ninth MOS transistor (M103), the square circuit comprising a supply means for increasing a current flowing through each of the ninth and tenth MOS transistors (M103, M104) by several times and supplying the resultant current to the seventh and eighth MOS transistors (M101, M102), the square circuit using a drain of the eighth MOS transistor (M102) as a current input, and connecting one of the ninth and tenth MOS transistors (M103, M104) to a fourth current source (13) while outputting a current flowing through the other ninth or tenth MOS transistor as a current mirror output, and the current mirror output serves as the bias current (Ia or Ib). With this configuration, transconductance control according to linearity or exponential can be achieved.

Preferably, in the variable transconductance circuit described above, the supply means includes a current mirror for increasing a current flowing through each of the ninth and tenth MOS transistors (M103, M104) by several times and supplying the resultant current to the seventh and eighth MOS transistors (M101, M102).

Preferably, in the variable transconductance circuit described above, the mirror ratio of the current mirror output is variable. With this configuration, transconductance control characteristics according to desired linearity or exponential can be achieved.

Preferably, in the variable transconductance circuit described above, the current value of the fourth current source is variable. With this configuration, transconductance control according to desired linearity or exponential can be achieved.

The optical disk device according to the present invention includes a filter including the variable transconductance circuit described above and a capacitance element or a variable gain amplifier including the variable transconductance circuit described above and a resistance element, placed on a signal processing path.

Effects of the variable gm circuit according to the present invention will be briefly described.

The first effect is that a variable gm circuit permitting a wide range of variation with a low power supply voltage can be attained in a small scale. The reason for this is that the current change amount required for varying gm can be reduced to enable a wide range of gm variation with one circuit.

The second effect is that high gm can be attained with low power consumption. The reason for this is that gm can be determined with the current ratio.

The variable transconductance circuit according to the present invention is applicable to filter circuits and variable gain amplifiers for optical disk devices such as DVDs, for example.

DESCRIPTION OF THE PREFERRED EMBODIMENTS

Figure 1:
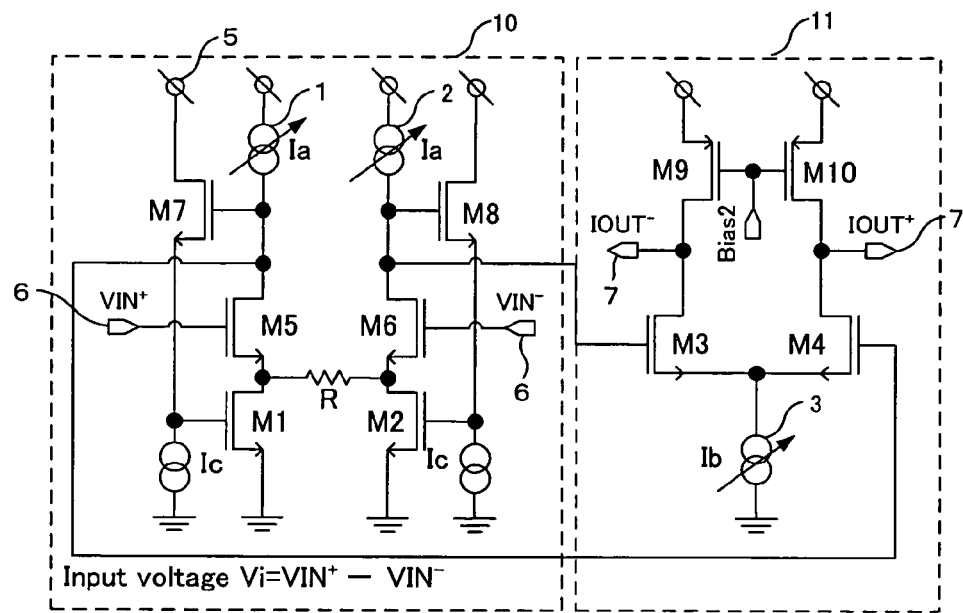
FIG. 1 shows a variable transconductance circuit of Embodiment 1 of the present invention.

Hereinafter, preferred embodiments of the present invention will be described with reference to the accompanying drawings. Note that the same or equivalent components are denoted by the same reference numerals.

Embodiment 1

FIG. 1 shows a variable transconductance circuit of Embodiment 1. In a linear voltage current conversion section, which is configured as described in the prior art, an input voltage signal Vi is converted to a current with an inter-source resistance R between MOS transistors M5 and M6, to give a drain current for MOS transistors M1 and M2. At this time, the gate voltage difference between the MOS transistors M1 and M2 is represented by expression (4):

$$\Delta Vg = \left( \sqrt{\frac{Ia + \frac{Vi}{R}}{k1 \cdot \beta}} - \sqrt{\frac{Ia - \frac{Vi}{R}}{k1 \cdot \beta}} \right) \quad (4)$$

where k1=gate width/gate length of MOS transistors M1 and M2 and β=charge mobility×capacity of gate oxide film/2.

The gate voltages of the MOS transistors M1 and M2 are driven with the sources of MOS transistors M7 and M8 each constituting a source follower. If a substrate bias effect of the MOS transistors M7 and M8 is neglected, the above value ΔVg is equal to the gate voltage difference between the MOS transistors M7 and M8, that is, the drain voltage difference between the MOS transistors M5 and M6. The drain voltages of the MOS transistors M5 and M6 are respectively input into the gates of MOS transistors M4 and M3. A current source 3 for supplying a current Ib is connected to the common-connected sources of the MOS transistors M3 and M4. The drains of the MOS transistors M3 and M4 are connected to MOS transistors M9 and M10 of which gates are common-connected. When ΔVg is input, a current ΔIout output from the drains of the MOS transistors M3 and M4 is represented by expression (5):

$$\Delta|out = k2 \cdot \beta \cdot \Delta Vg \cdot \sqrt{\frac{2 \cdot Ib}{k2 \cdot \beta} - \Delta Vg^2} \quad (5)$$

where k2 is the gate width/gate length of the MOS transistors M3 and M4.

Substitution of Expression (4) into Expression (5) yields Expression (6):

$$\Delta|out = \sqrt{2} \cdot k3 \cdot \left( \sqrt{Ia + \frac{Vi}{R}} - \sqrt{Ia - \frac{Vi}{R}} \right) \cdot \quad (6)$$

$$\sqrt{\frac{Ib}{k3} - Ia + \sqrt{Ia^2 - \left(\frac{Vi}{R}\right)^2}}$$

$$\cong \frac{Vi}{R} \sqrt{\frac{2 \cdot k3 \cdot Ib}{Ia}} \text{ (First-order approximation)}$$

where k3=k2/k1. From the above, gm is represented by Expression (7):

$$gm = \frac{1}{R} \sqrt{\frac{2 \cdot k3 \cdot Ib}{Ia}} \quad (7)$$

It is found from the above expression that by varying Ia and Ib up to 10 times their minimum values (Ia×1/10, Ib×10), gm is allowed to vary up to 10 times its minimum value. Therefore, gm is allowed to vary over a wide range with a current variation smaller than that in the prior art discussed with reference to Expression (3), that is, with a low power supply voltage. Also, since gm can be determined with the current ratio, it is advantageously possible to achieve high gm with a smaller operating current.

Embodiment 2

Figure 2:
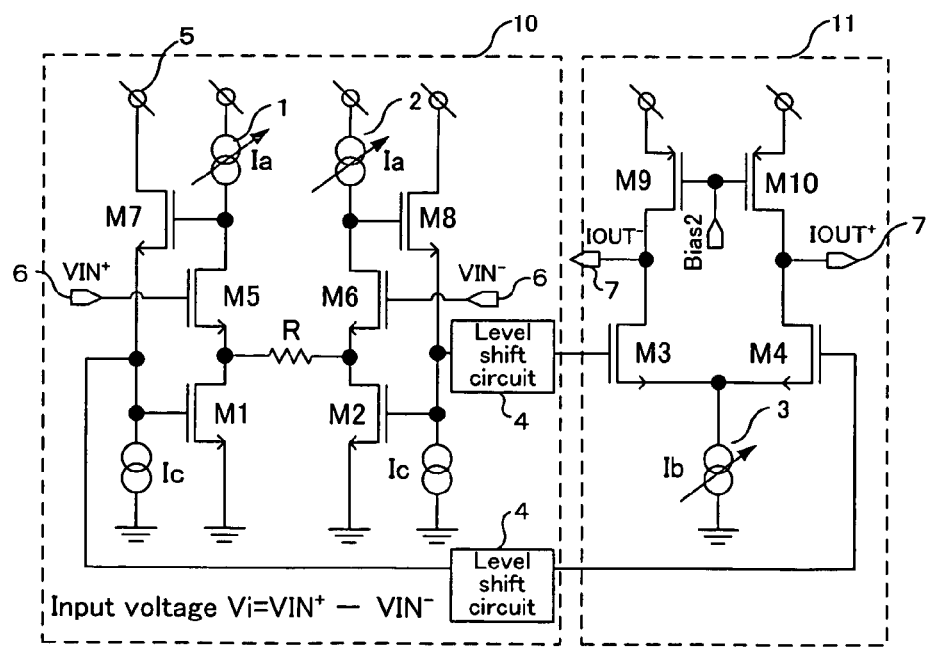
FIG. 2 shows a variable transconductance circuit of Embodiment 2 of the present invention.

FIG. 2 shows a variable transconductance circuit of Embodiment 2. In the variable transconductance circuit of FIG. 1, the gate voltages of the MOS transistors M4 and M3 are automatically determined with the gate-source voltages of the MOS transistors M1 and M7 and the MOS transistors M2 and M8, respectively. Therefore, to allow operation of the MOS transistors M3 and M4 in the saturation region, the output dynamic range is automatically determined, and this restricts the degree of design freedom. To solve this problem, in the variable transconductance circuit of FIG. 2, a level shift circuit 4 is interposed each between the gates of the MOS transistors M1 and M4 and between the gates of the MOS transistors M2 and M3. By appropriately setting the DC level shift amount of each of the level shift circuits 4, the degree of design freedom of the output dynamic range is improved. Alternatively, if the input impedance is sufficiently high, the level shift circuit 4 may be interposed each between the drain of the MOS transistor M5 and the gate of the MOS transistor M4 and between the drain of the MOS transistor M6 and the gate of the MOS transistor M3 in FIG. 1.

Embodiment 3

In the configurations in FIGS. 1 and 2, the MOS transistors M1, M5 and M7 or the MOS transistors M2, M6 and M8 constitute a negative feedback loop. The unity gain frequency f0 of such a loop and Ia have the relationship of Expression (8) below, and thus the circuit frequency characteristic varies with gm.

$$f0 \propto \sqrt{Ia} \quad (8)$$

Figure 3:
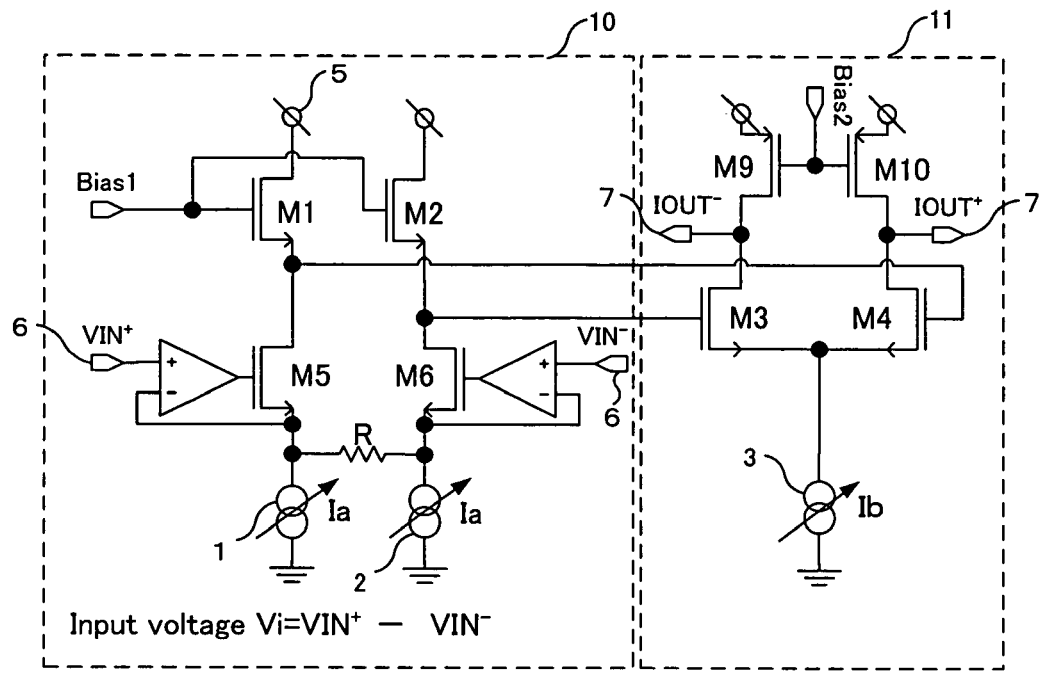
FIG. 3 shows a variable transconductance circuit of Embodiment 3 of the present invention.

FIG. 3 shows a variable transconductance circuit of Embodiment 3 for solving the above problem. The MOS transistor M5 and a current source 1 constitute an output source follower for an operational amplifier, and the MOS transistor M6 and a current source 2 constitute another output source follower. The resistance R is connected between the outputs of the source followers. When the voltage signal Vi is input, the voltage difference of Vi also occurs at both ends of the resistance R, allowing flow of a signal current of Vi/R. This signal current, output from the drains of the MOS transistors M5 and M6, is input into the MOS transistors M1 and M2 of which gates are grounded with Bias 1. The gate-source voltage difference between the MOS transistors M1 and M2 at this time is as represented by Expression (4) above. Thus, the circuit of FIG. 3 can obtain the transconductance represented by Expression (7) above like the circuit operation described in Embodiment 1.

Figure 4:
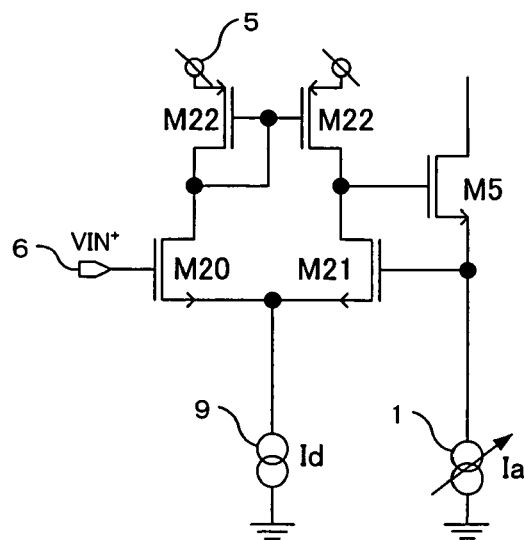
FIG. 4 shows an example of configuration of an operational amplifier shown in FIG. 3.

FIG. 4 shows an example of configuration of the operational amplifier shown in FIG. 3. The unity gain frequency f0 of the operational amplifier is as represented by Expression (9) below. As long as the frequency band of the source follower composed of the MOS transistor M5 and the current source 1 is sufficiently high with respect to f0, the frequency characteristic of the transconductance circuit of FIG. 3 will not vary even if gm is varied.

$$f0 \propto \sqrt{Id} \quad (9)$$

Note that in FIGS. 1, 2 and 3, the case that input transistors were N-channel transistors was described. It is however needless to mention that the channel conductivity type of the transistors may be reversed.

Also, in FIGS. 1, 2 and 3, the resistance R may be replaced with a MOS transistor operating in the linear region, and the gate voltage of the transistor may be varied together with Ia and Ib. This permits gm to be variable in a wider range.

Embodiment 4

Figure 5:
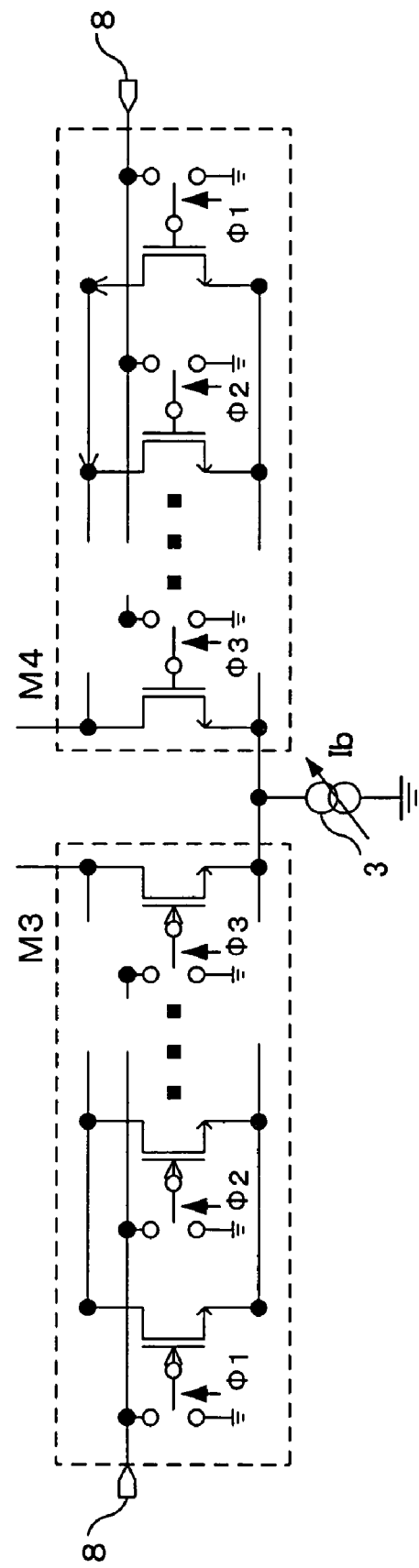
FIG. 5 shows an alteration to a square root expansion section 11 shown in FIGS. 1 to 3.

FIG. 5 shows an alteration to a square root expansion section 11 shown in FIGS. 1 to 3. The gm of the variable transconductance circuits of FIGS. 1 to 3 depends on the transistor size ratio k3 of the MOS transistors M1 and M2 to the MOS transistors M3 and M4, as is found from Expression (7). In FIG. 5, in place of each of the MOS transistors M3 and M4, a plurality of MOS transistors are connected in parallel and switched with control signals φ1 to φ3. This permits k3 to vary, and thus gm can be made variable. Although the MOS transistors M3 and M4 were replaced in FIG. 5, each of the MOS transistors M1 and M2 may be replaced with parallel-connected MOS transistors.

Embodiment 5

Figure 6A:
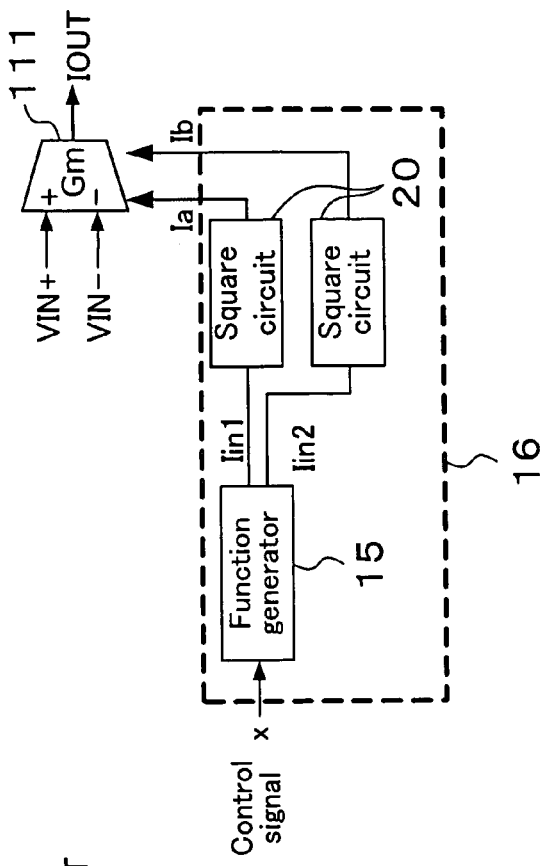
FIGS. 6A and 6B show examples of a transconductance control circuit provided for any of the variable transconductance circuits of FIGS. 1 to 3.
Figure 6B:
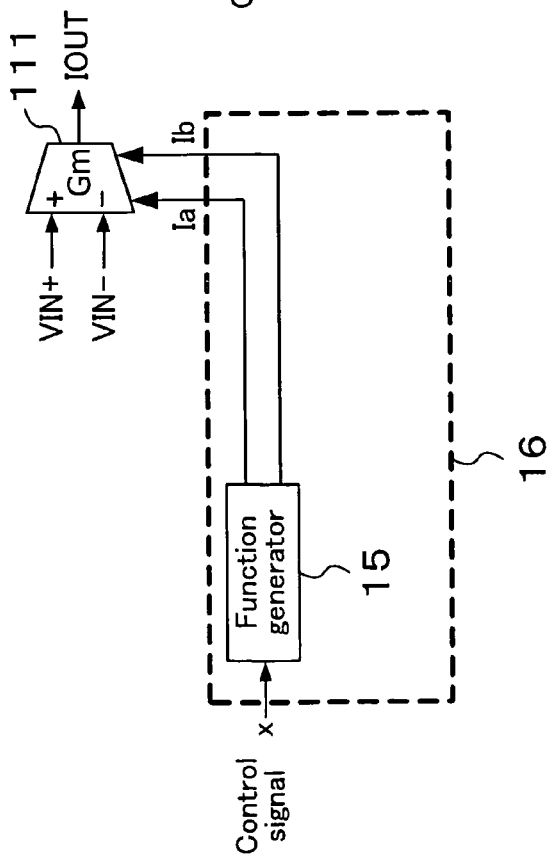

FIGS. 6A and 6B show examples of a transconductance control circuit 16 provided for any of the variable transconductance circuits of FIGS. 1 to 3, denoted by 111. First, the operation of square circuits 20 included in the transconductance control circuit 16 of FIG. 6B will be described with reference to FIG. 7.

Figure 7:
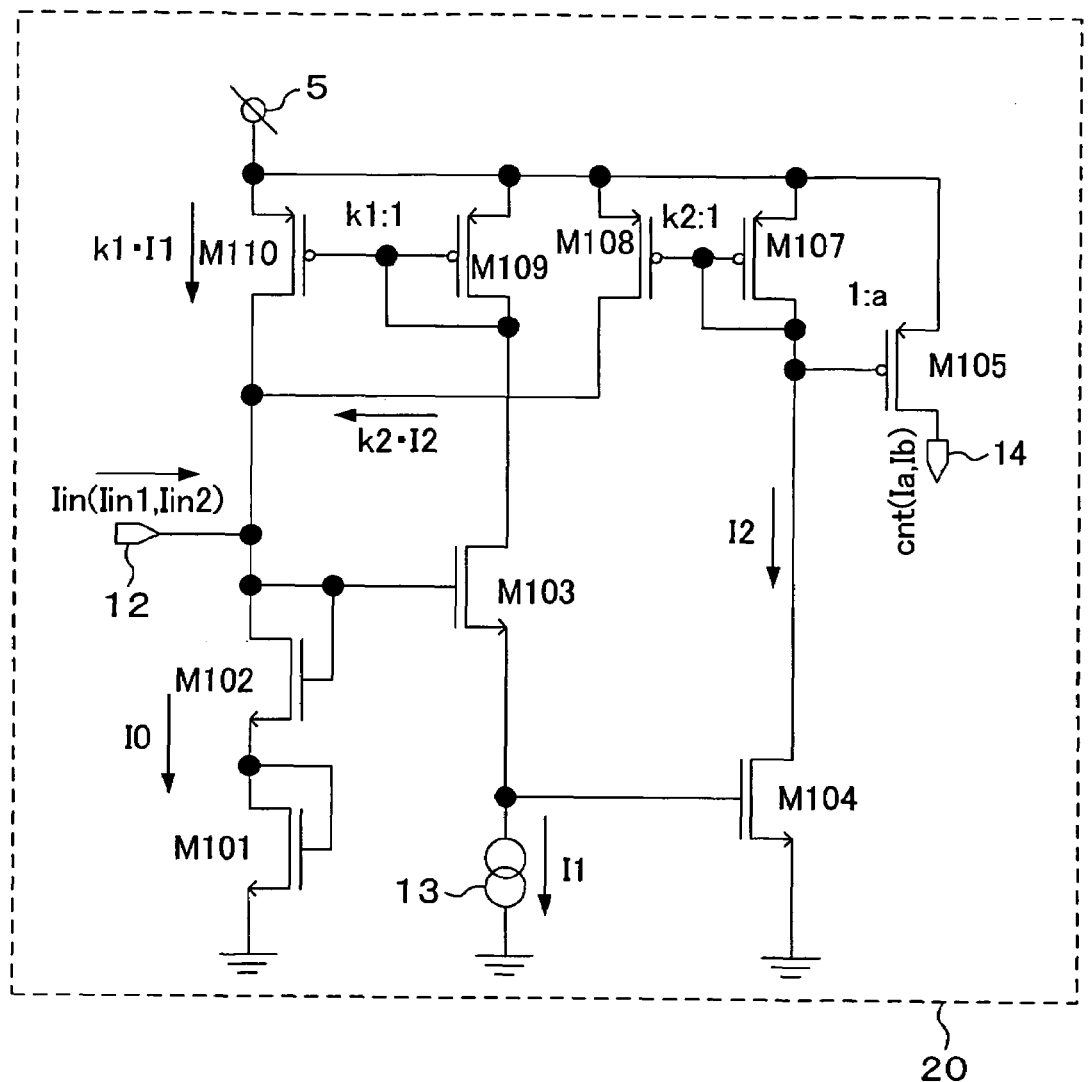
FIG. 7 shows an example of configuration of a square circuit included in the transconductance control circuit of FIG. 6B.

Referring to FIG. 7, Iin denotes a current input and cnt denotes a square current output. N-channel transistors M101 to M104 constitute a trans-linear loop circuit, while P-channel transistors M107 to M110 constitute a current mirror circuit. The current mirror circuit is connected to the drains of the MOS transistor M103 driven with a current source 13 and the MOS transistor M104 of which source is grounded. The current mirror circuit multiplies the currents flowing through the MOS transistors M103 and M104 by k1 and k2, respectively, sums the multiplied currents, and supplies the resultant current to the MOS transistors M101 and M102. A MOS transistor M105 constitutes a current mirror circuit that multiplies the current from the MOS transistor M107 by a and outputs the resultant current. Assuming that the transistor size ratios of the MOS transistors M102, M103 and M104 to the transistor size of the MOS transistor M101 as the reference are n2, n3 and n4, respectively, Expression (10) below is established among currents I0, I1 and I2 shown in FIG. 7.

$$\sqrt{I0} + \sqrt{\frac{I0}{n2}} = \sqrt{\frac{I1}{n3}} + \sqrt{\frac{I2}{n4}} \quad (10)$$

By squaring both terms of the above expression and substituting I0=Iin+k1·I1+k2·I2 into this expression, Expression (11) below is obtained:

$$\left(1 + \sqrt{\frac{1}{n2}}\right)^2 (Iin + k1 \cdot I1 + k2 \cdot I2) = \frac{I1}{n3} + \frac{I2}{n4} + 2 \cdot \sqrt{\frac{I1 \cdot I2}{n3 \cdot n4}} \quad (11)$$

By substituting Expression (12):

$$k1 = \frac{1}{n3 \cdot \left(1 + \sqrt{\frac{1}{n2}}\right)^2} \quad (12)$$

$$k2 = \frac{1}{n4 \cdot \left(1 + \sqrt{\frac{1}{n2}}\right)^2}$$

into Expression (11) above and arranging the result, Expression (13) below is given, in which I2 has a square characteristic with respect to the input current Iin.

$$I2 = \frac{n3 \cdot n4}{4 \cdot I1}\left(1 + \sqrt{\frac{1}{n2}}\right)^4 Iin^2 \quad (13)$$

Multiplying the above value by a gives the output current, and finally Expression (14) below is obtained.

$$Iout1 = Iout2 = E \cdot Iin^2 \quad (14)$$

$$E = a \cdot \frac{n3 \cdot n4}{4 \cdot I1}\left(1 + \sqrt{\frac{1}{n2}}\right)^4$$

From the above expression, it is found that since the circuit of FIG. 7 does not include a device parameter β and has a square characteristic determined with the parameters a, n2, n3 and n4 and the current I1 having relative precision, the circuit is advantageously less susceptible to fabrication variation.

Figure 8:
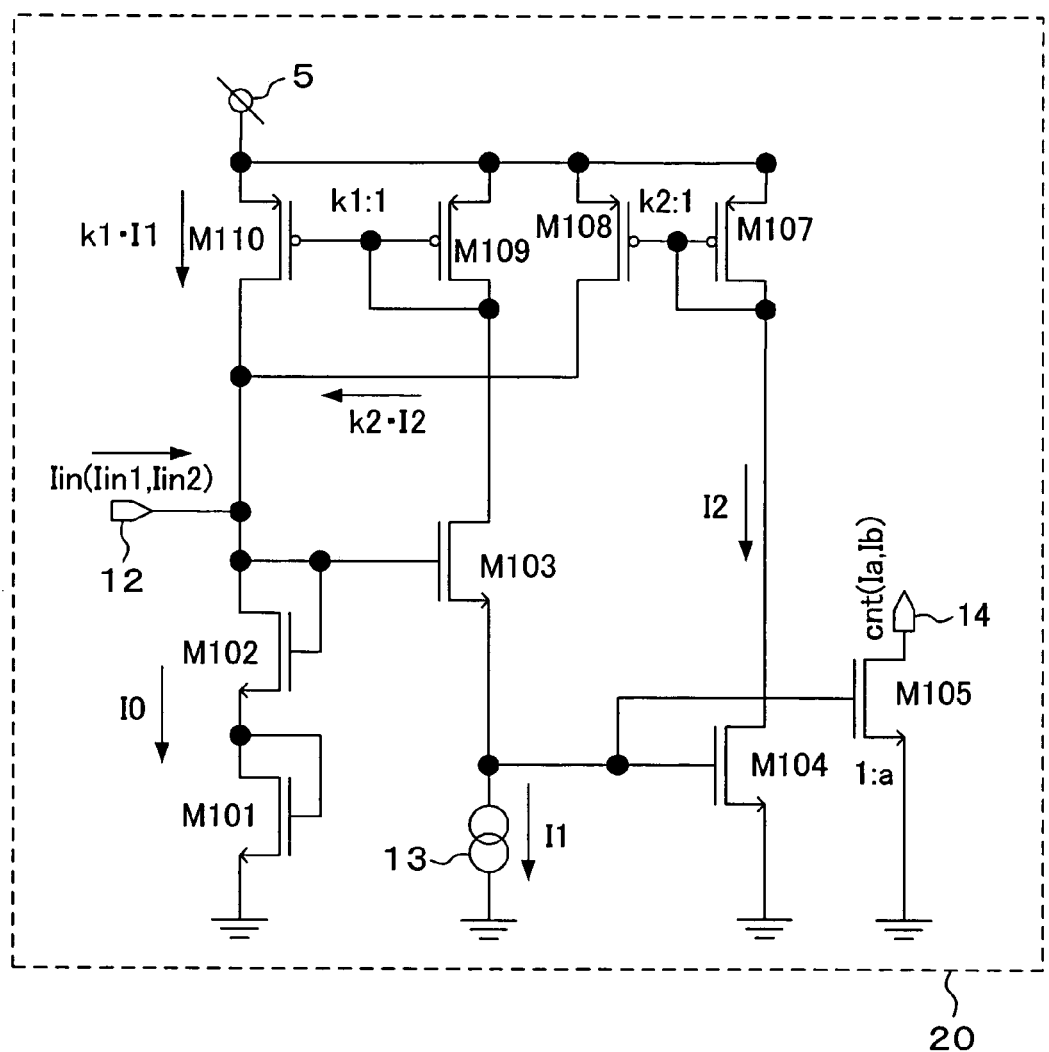
FIG. 8 shows another example of configuration of the square circuit included in the transconductance control circuit of FIG. 6B.

The current output may be made as shown in FIG. 8 depending on the polarity of the necessary output current. Alternatively, in the examples of FIGS. 7 and 8, the transistor M104 may be driven with a constant current to allow the current I1 to be output as current mirror output. If it is desired to change the square characteristic of the square circuits of FIGS. 7 and 8, this can be achieved by changing the transistor size ratio a or the current I1.

Next, control of the transconductance will be described with reference to FIGS. 6A and 6B, in the case of a circuit in which transconductance varies exponentially with a control signal.

In FIG. 6A, when a control signal x is changed to give Ia∝1+x and Ib∝1−x with a function generator 15, the transconductance is represented by Expression (15) below from Expression (7) above.

$$gm \propto \sqrt{\frac{1-x}{1+x}} \quad (15)$$

Figure 9:
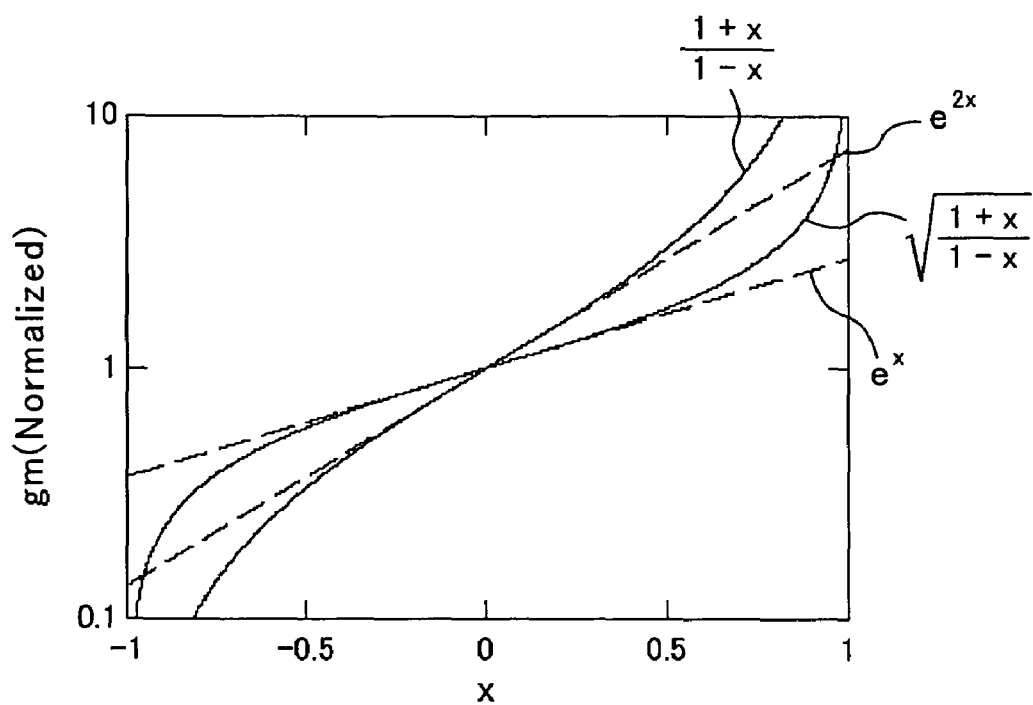
FIG. 9 shows transconductance control characteristics.

This expression can be approximated to $gm \propto e^x$ in a specific range of x as shown in FIG. 9. Therefore, the transconductance can be varied exponentially.

Figure 10:
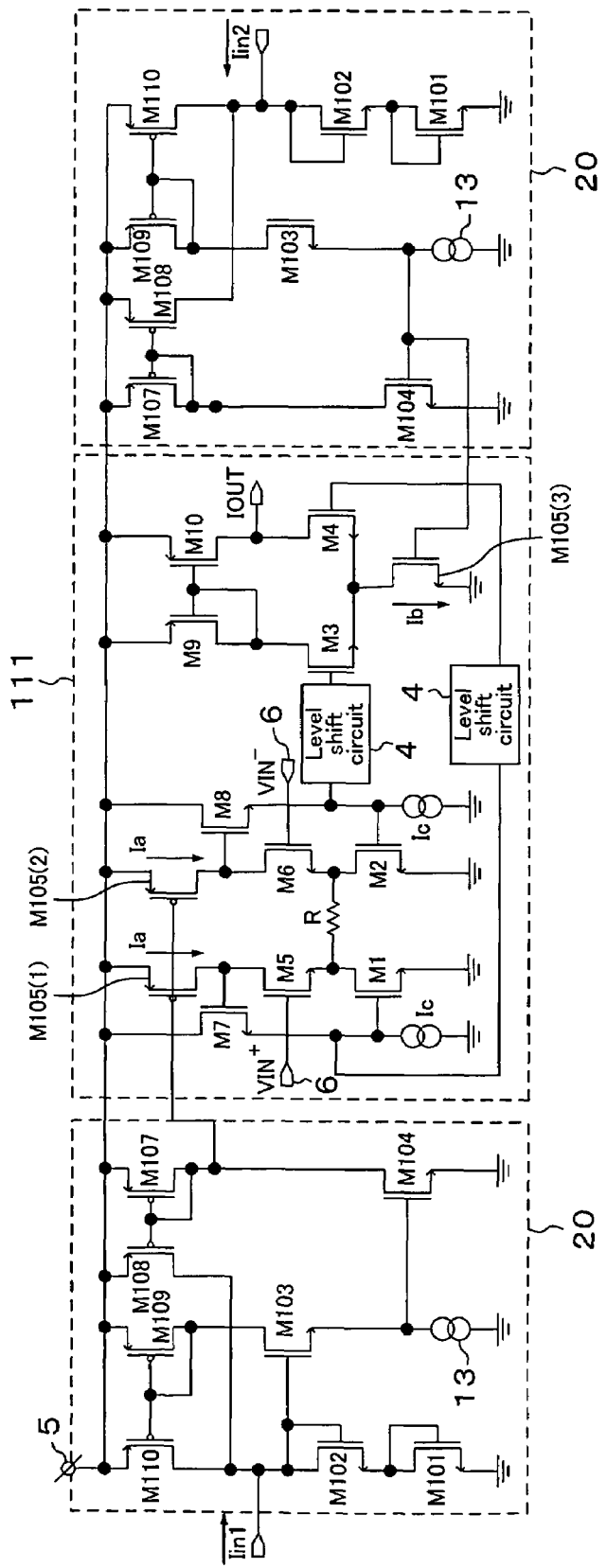
FIG. 10 shows an example of connection between the variable conductance circuit of FIG. 2 and the square circuits.

However, if the range of x is widened in an attempt of widening the variable width of gm, the approximation accuracy deteriorates. To solve this problem, in FIG. 6B, the transconductance control circuit 16 is provided with the square circuits 20. FIG. 10 shows an example of connection of the square circuits 20 with the variable transconductance circuit 111 having the configuration of FIG. 2, for example. When the control signal x is changed to give Iin1∝1+x and Iin2∝1−x with the function generator 15, Ia∝(1+x)² and Ib∝(1−x)² are given. From Expression (7) above, the transconductance is represented by Expression (16):

$$gm \propto \frac{1-x}{1+x} \quad (16)$$

Figure 11:
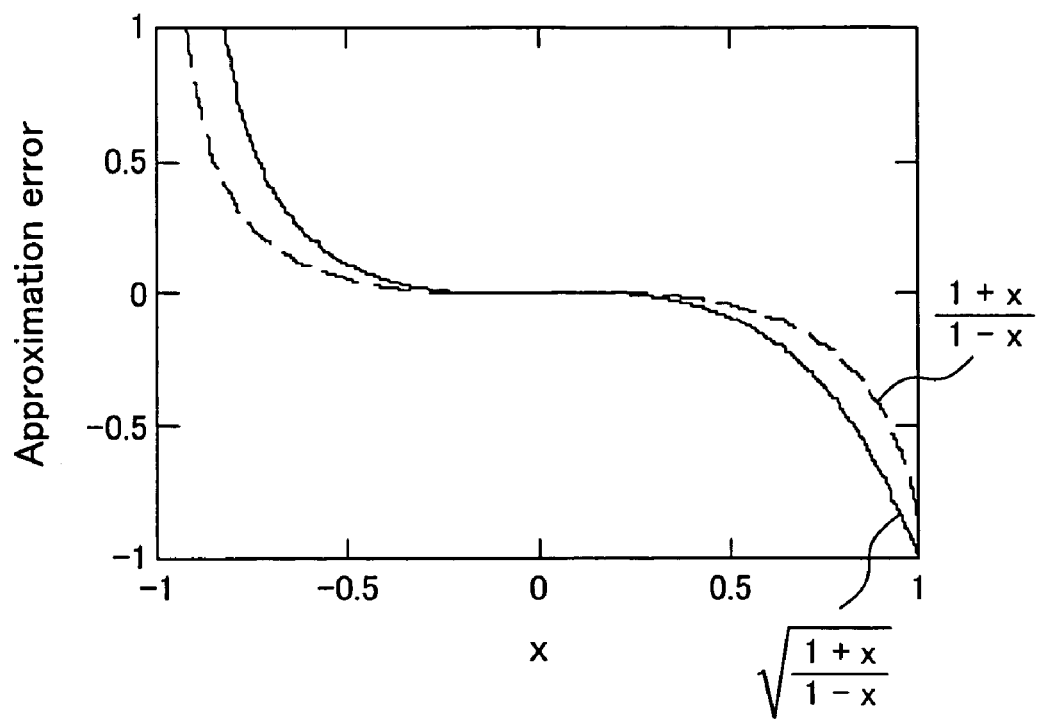
FIG. 11 shows an approximate error of the transconductance control characteristics.

This expression can be approximated to $gm \propto e^{2x}$ in a specific range of x as shown in FIG. 9. FIG. 11 shows an exponential approximation error between Expressions (15) and (16). By providing the square circuits 20, the approximation accuracy can be enhanced even if the range of x is widened to widen the variable width of gm.

Embodiment 5

Figure 12:
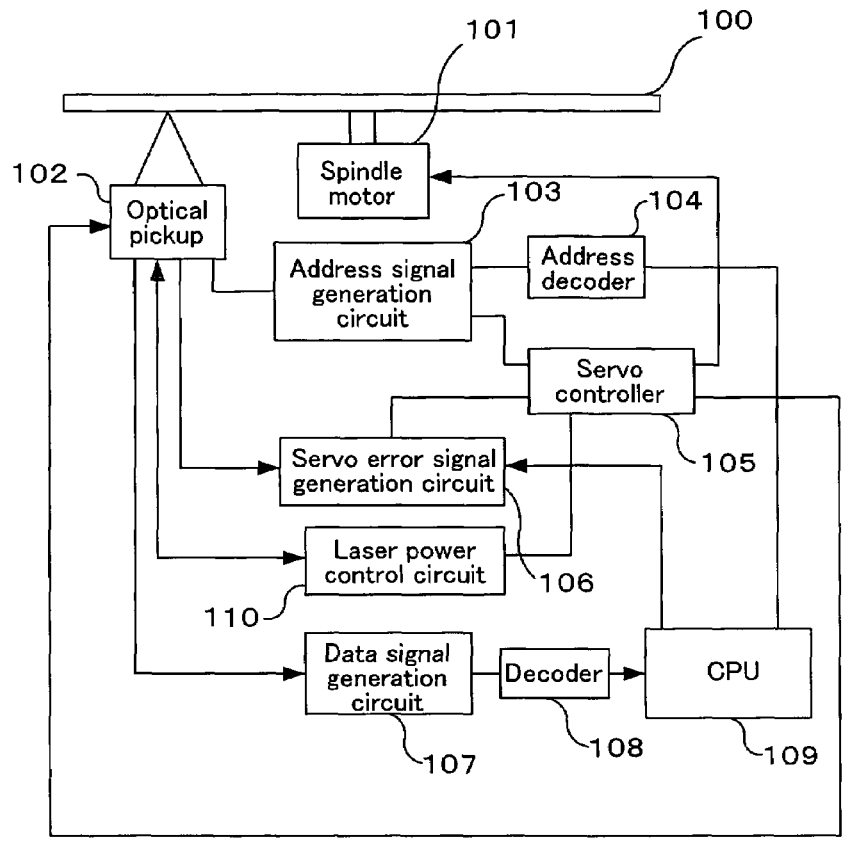
FIG. 12 shows an example of configuration of an optical disk device.

FIG. 12 shows an optical disk device of Embodiment 5. The optical disk device includes a spindle motor 101, an optical pickup 102, an address signal generation circuit 103, an address decoder 104, a servo controller 105, a servo error signal generation circuit 106, a data signal generation circuit 107, a decoder 108, a CPU 109 and a laser power control circuit 110.

Figure 13:
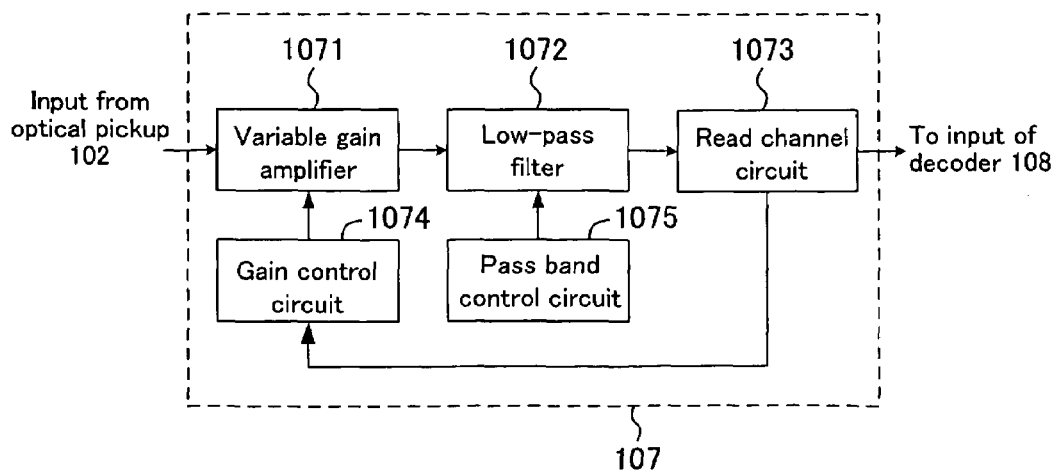
FIG. 13 shows an example of configuration of a data signal generation circuit in FIG. 12.

Hereinafter, as one of applications of the variable gm circuit according to the present invention, application thereof to the data signal generation circuit 107 in FIG. 12 will be described. Note however that the variable gm circuit according to the present invention is also applicable to the address signal generation circuit 103, the servo error signal generation circuit 106 and the laser power control circuit 110. FIG. 13 shows an internal configuration of the data signal generation circuit 107.

Figure 14A:
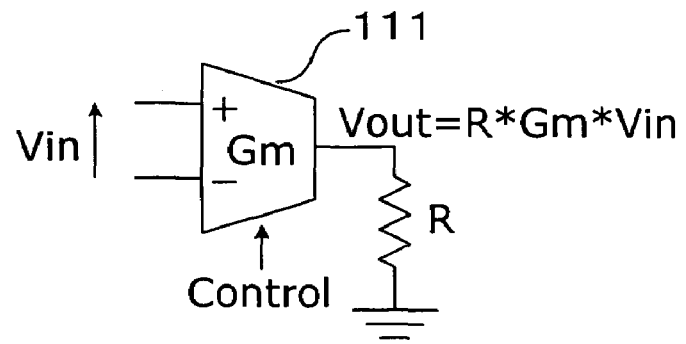
FIGS. 14A and 14B show examples of configurations of a variable gain amplifier and a low-pass filter, respectively, using the variable transconductance circuit according to the present invention.
Figure 14B:
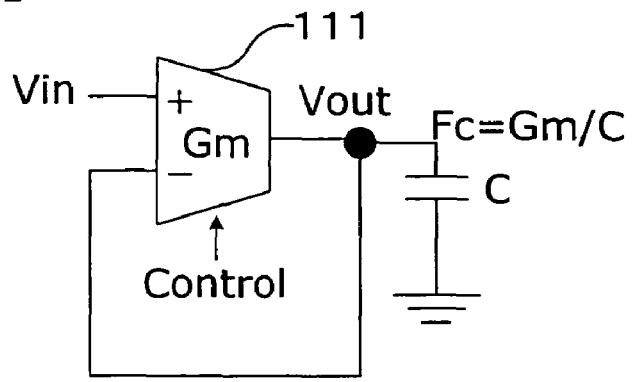
Figure 15:
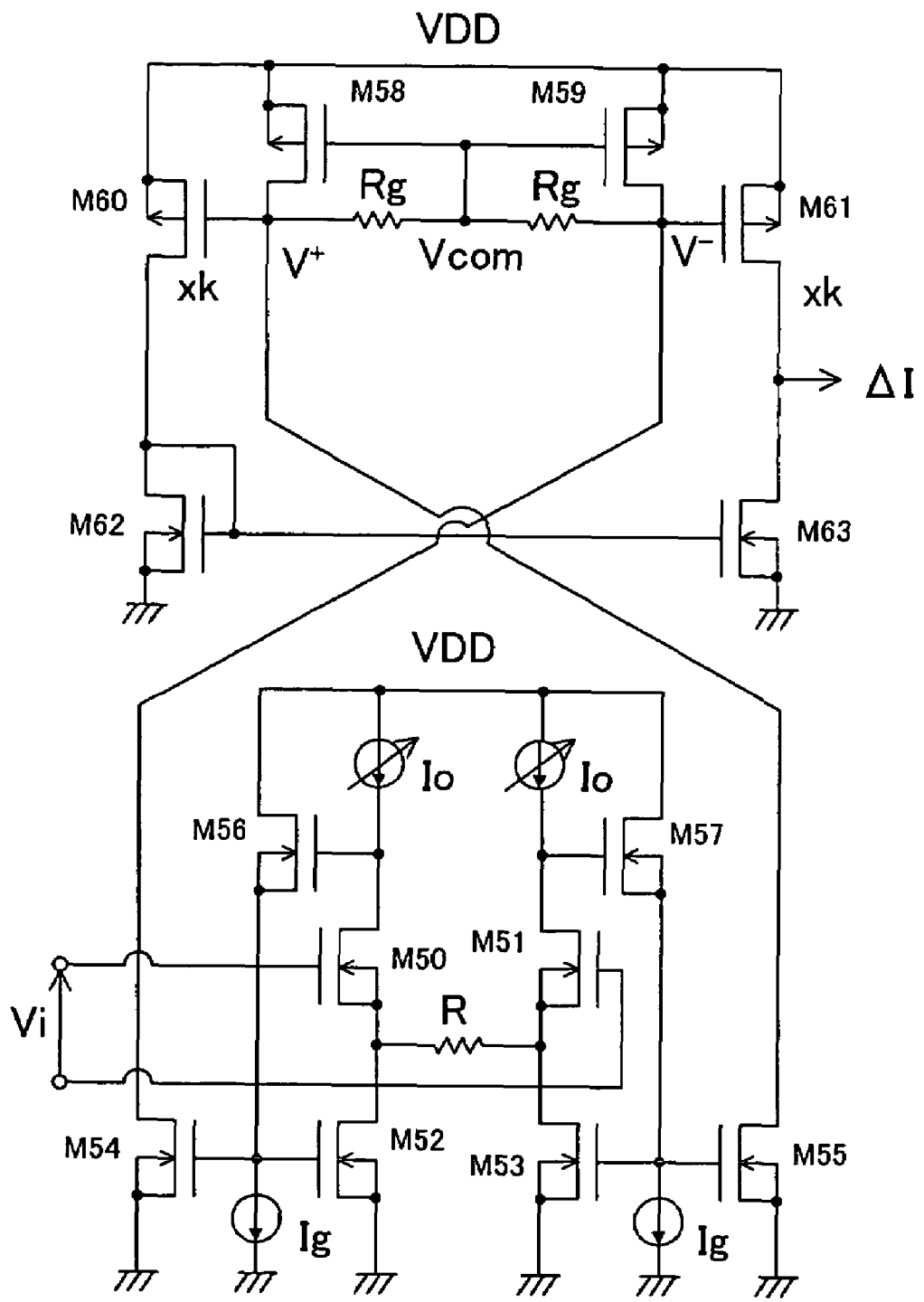
FIG. 15 shows a conventional variable transconductance circuit.

A data signal obtained from an optical disk 100 must be subjected to amplitude normalization and noise removal to improve the readability thereof. To accomplish this, a variable gain amplifier 1071 and a low-pass filter 1072 are provided on the signal processing path as shown in FIG. 13. The variable gain amplifier 1071 normalizes the signal amplitude with a gain switched in a gain control circuit 1074 in response to the signal amplitude value detected in a read channel circuit 1073. The low-pass filter 1072 is allowed to change its cut-off frequency under the control of a pass band control circuit 1075 to attain invariably optimal noise removal in response to the medium type and speed of the optical disk 100. FIGS. 14A and 14B show examples of the variable gain amplifier 1071 and the low-pass filter 1072, respectively, made up of the variable gm circuit according to the present invention. As shown in FIG. 14A, a resistance is connected to the variable gm circuit 111 to give the variable gain amplifier 1071, in which the gain is determined with Gm×R. As shown in FIG. 14B, a capacitance is connected to the variable gm circuit 111 to give the low-pass filter 1072, in which the cut-off frequency Fc is determined with Gm/C. For simplification, the low-pass filter 1072 of FIG. 14B is of a first-order configuration. In actual optical disk devices, however, fifth- to seventh-order low-pass filters may be used.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A variable transconductance circuit comprising:
   a voltage-current conversion circuit for outputting a current signal linear with an input voltage signal;
   first and second MOS transistors for converting the current signal received to a square-root compressed or approximately square-root compressed voltage signal; and
   third and fourth MOS transistors for converting the square-root compressed or approximately square-root compressed voltage signal to a linear current signal, wherein:
   transconductance is controlled by varying a bias current for the first and second MOS transistors and a bias current for the third and fourth MOS transistors,
   the voltage-current conversion circuit comprises:
   two operational amplifiers into which the input voltage signal is input; and
   a resistance interposed between outputs of the two operational amplifiers,
   each of the outputs of the two operational amplifiers serves as a source follower biased with a first current source or a second current source, and the current signal is taken from a drain of the source follower,
   gates of the first and second MOS transistors are biased with a predetermined bias voltage, and the current signal output from the voltage-current conversion circuit is input into sources of the first and second MOS transistors,
   sources of the third and fourth MOS transistors are common-connected, a third current source is connected to the common-connected sources, and a gate of the third MOS transistor is connected to a source of one of the first and second MOS transistors while a gate of the fourth MOS transistor is connected to a source of the other first or second MOS transistor, the variable transconductance circuit uses drains of the third and fourth MOS transistors as current outputs, and controls transconductance by varying the current from the first and second current sources and the current from the third current source.

2. A variable transconductance circuit comprising:

a voltage-current conversion circuit for outputting a current signal linear with an input voltage signal;

first and second MOS transistors for converting the current signal received to a square-root compressed or approximately square-root compressed voltage signal; and third and fourth MOS transistors for converting the square-root compressed or approximately square-root compressed voltage signal to a linear current signal, wherein:

transconductance is controlled by varying a bias current for the first and second MOS transistors and a bias current for the third and fourth MOS transistors, each of the first and second MOS transistors or the third and fourth MOS transistors is composed of a plurality of MOS transistors connected in parallel, and transconductance is controlled by switching.

3. A variable transconductance circuit comprising:

a voltage-current conversion circuit for outputting a current signal linear with an input voltage signal;

first and second MOS transistors for converting the current signal received to a square-root compressed or approximately square-root compressed voltage signal; and third and fourth MOS transistors for converting the square-root compressed or approximately square-root compressed voltage signal to a linear current signal, wherein:

transconductance is controlled by varying a bias current for the first and second MOS transistors and a bias current for the third and fourth MOS transistors, the variable transconductance circuit further comprises a transconductance control circuit for generating the bias currents, the transconductance control circuit comprises:

a square circuit comprising a trans-linear loop circuit including vertically-connected seventh and eighth MOS transistors with a gate and drain of each transistor being connected to each other, a ninth MOS transistor of which gate is connected to the gate of the eighth MOS transistor, and a tenth MOS transistor of which gate is connected to a source of the ninth MOS transistor, the square circuit comprising a supply means for increasing a current flowing through each of the ninth and tenth MOS transistors by several times and supplying the resultant current to the seventh and eighth MOS transistors, the square circuit using a drain of the eighth MOS transistor as a current input, and connecting one of the ninth and tenth MOS transistors to a fourth current source while outputting a current flowing through the other ninth or tenth MOS transistor as a current mirror output, and the current mirror output serves as the bias current.

4. The variable transconductance circuit of claim 3, wherein the supply means includes a current mirror for increasing a current flowing through each of the ninth and tenth MOS transistors by several times and supplying the resultant current to the seventh and eighth MOS transistors.

5. The variable transconductance circuit of claim 3, wherein the mirror ratio of the current mirror output is variable.

6. The variable transconductance circuit of claim 3, wherein the current value of the fourth current source is variable.

* * * * *